United States Patent
Tei et al.

(10) Patent No.: US 8,191,759 B2
(45) Date of Patent: Jun. 5, 2012

(54) WIRE BONDING APPARATUS AND WIRE BONDING METHOD

(75) Inventors: Shinsuke Tei, Tokyo (JP); Toshihiko Toyama, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 13/177,749

(22) Filed: Jul. 7, 2011

(65) Prior Publication Data

US 2011/0278349 A1 Nov. 17, 2011

Related U.S. Application Data

(63) Continuation of application No. PCT/JP2009/062688, filed on Jul. 13, 2009.

(30) Foreign Application Priority Data

Jan. 7, 2009 (JP) ................................. 2009-001961

(51) Int. Cl.
*B23K 31/02* (2006.01)
(52) U.S. Cl. ...................................... 228/180.5; 228/4.5
(58) Field of Classification Search ........................ None
See application file for complete search history.

(56) References Cited

U.S. PATENT DOCUMENTS

| | | | |
|---|---|---|---|
| 5,024,367 A | 6/1991 | Terakado et al. | |
| 5,524,811 A | 6/1996 | Terakado et al. | |
| 5,723,364 A * | 3/1998 | Nakamura et al. | ............ 438/617 |
| 5,797,388 A * | 8/1998 | Nakamura et al. | ......... 228/180.5 |
| 5,897,049 A * | 4/1999 | Nakamura et al. | ......... 228/180.5 |
| 5,981,371 A * | 11/1999 | Yamazaki et al. | ............ 438/617 |
| 7,686,204 B2 | 3/2010 | Takahashi et al. | |
| 7,857,190 B2 | 12/2010 | Takahashi et al. | |
| 2001/0002607 A1* | 6/2001 | Sugiura et al. | .................. 156/91 |
| 2001/0023534 A1* | 9/2001 | Tamai et al. | .................... 29/843 |
| 2007/0187138 A1 | 8/2007 | Takahashi et al. | |
| 2007/0187467 A1* | 8/2007 | Toyama et al. | ............... 228/101 |
| 2007/0246513 A1* | 10/2007 | Tei et al. | ........................ 228/101 |
| 2008/0023028 A1* | 1/2008 | Fujita | ............................ 134/1.1 |
| 2010/0133322 A1 | 6/2010 | Takahashi et al. | |
| 2010/0206849 A1 | 8/2010 | Takahashi et al. | |

FOREIGN PATENT DOCUMENTS

| | | |
|---|---|---|
| JP | 58-131744 | 8/1983 |
| JP | 62-11242 | 1/1987 |
| JP | 1-35500 | 7/1989 |
| JP | 2-199846 | 8/1990 |

(Continued)

OTHER PUBLICATIONS

International Search Report dated Sep. 8, 2009, from the corresponding International Application.

*Primary Examiner* — Kiley Stoner
(74) *Attorney, Agent, or Firm* — Katten Muchin Rosenman LLP

(57) ABSTRACT

Provided is a wire bonding apparatus including: a wire cutting unit configured to cut a wire by bonding the wire using a capillary and then moving the capillary and a first clamper upward while the first clamper remains closed; and a wire extending unit configured to extend a tail wire from a tip end of the capillary by moving the capillary upward and then moving the capillary and the first clamper upward in a state in which the first clamper is opened and a second clamper is closed. The wire bonding apparatus having such a structure effectively prevents the wire from falling out and bending.

5 Claims, 9 Drawing Sheets

FOREIGN PATENT DOCUMENTS

| | | | |
|---|---|---|---|
| JP | 04-372146 A | * | 12/1992 |
| JP | 5-144820 | | 6/1993 |
| JP | 6-132344 | | 5/1994 |
| JP | 2530224 | | 6/1996 |
| JP | 09-162225 A | * | 6/1997 |
| JP | 2723277 | | 11/1997 |
| JP | 2969953 | | 8/1999 |
| JP | 3128718 | | 11/2000 |
| JP | 2007-180348 | | 7/2007 |

* cited by examiner

WIRE BONDING APPARATUS AND WIRE BONDING METHOD

BACKGROUND OF THE INVENTION

1. Technical Field

The present invention relates to a structure of a wire bonding apparatus and a bonding method employed by such a wire bonding apparatus.

2. Description of the Related Art

In an assembling process of a semiconductor such as an IC, a wire bonding apparatus that typically connects a pad of a semiconductor chip with a lead of a lead frame using a wire is used. According to the wire bonding apparatus, bonding to the pad is performed using a capillary by causing a wire to extend from a tip end of the capillary and forming the extended wire into an initial ball using such as an electronic flame off. Subsequently, the capillary is moved upward and toward the lead while feeding the wire in a looping operation, and then bonding the wire to a second bonding point is performed using the capillary. Upon completion of the bonding the wire to the lead, the capillary is moved upward while feeding the wire from the tip end of the capillary, and then a clamper is closed. Then, the capillary and the clamper are moved further upward, and whereby the wire is cut in a state in which a tail wire of a predetermined length is extending from the tip end of the capillary. Subsequently, the capillary is moved to a position of the electronic flame off, the tail wire rolls up into an initial ball, and then bonding the wire to the next first bonding point is performed. Pads and leads are sequentially connected by repeating bonding in this manner.

The wire can be cut by holding the wire with the clamper and moving the wire upward after bonding to the lead, because the wire can be easily cut at an end portion of the wire bonded to the lead as this portion is crushed with the capillary when bonded and therefore the cross-sectional area is smaller than in other portions of the wire.

However, the cross-sectional area of the end portion of the wire bonded to the lead is often not sufficiently small depending on the bonding condition. In such a case, holding the wire with the clamper and moving the wire upward cannot cut the wire easily, and the wire is cut only after a large tensile force is applied to the wire. This causes the wire to flip up due to a reaction force of the large tensile force applied to the wire when cutting, and causes the wire and the tail wire under the clamper to bend in an S shape. The bend in the tail wire often results in defective ball formation that is carried out by such as electric discharges. Even if a ball is formed in a good condition, the wire in the capillary or between the capillary and the clamper still includes the bend. Accordingly, performing the bonding using such a bent wire adversely causes the wire connecting the pad and the lead to include an S-shaped portion, and possibly results in a problem that two adjacent wires are brought into contact with each other.

Thus, there are proposed various methods including a method of cutting a wire by holding the wire with a clamper and moving the wire upward after a capillary and the clamper are moved transversely such that a central axis of vertical movement of the capillary and the clamper is aligned with an end portion of bonding before holding the wire with the clamper and pulling the tail wire upward (see Japanese Patent No. 2723277, for example), and a method of moving a capillary in a transverse direction at the same time as an application of ultrasonic vibration in bonding (see Japanese Patent No. 3128718, for example). There are also proposed a method of opening a clamper to extend a tail wire, causing the capillary to vibrate at a natural frequency of the tail wire, and resonating the tail wire and cut the wire, thereby cutting the tail wire by the vibration (see Japanese Patent No. 2969953, for example), and a method of causing a capillary to perform a scrubbing operation when bonding while pressing the wire against a bonding surface using the capillary (see Japanese Patent No. 2530224, for example).

Depending on the bonding condition, the wire is possibly cut during the bonding and falls out from the capillary (fall-out of the wire). There is proposed a method of, when the fall-out of the wire occurs, causing a wire-holding clamper to close and a wire-cutting clamper to open, moving the wire-cutting clamper upward along with the capillary to a position higher than the wire-holding clamper, thereby inserting the wire into the capillary (see Japanese Examined Patent Application Publication No. H01-35500, for example).

However, according to the conventional bonding methods described in Japanese Patent No. 2723277 and Japanese Patent No. 2969953, when bonding the wire to the lead, it is required to adjust such as a pressing force of the capillary such that the cross-sectional area of the end portion of the wire bonded to the lead is smaller than that of other portions of the wire. If the pressing force of the capillary is too large, the wire is cut at the same time as the wire is bonded to the lead and the wire falls out from the capillary, resulting in the fall-out of the wire. If the pressing force of the capillary is too small, it is necessary to move the wire upward with a greater strength even with the method described in Japanese Patent No. 2723277 or Japanese Patent No. 2969953, and thus the wire is adversely deformed into an S shape. Moreover, according to the conventional methods described in Japanese Patent No. 3128718 and Japanese Patent No. 2530224, the problem of the fall-out of the wire can occur as the wire can be cut as in the case of the conventional techniques disclosed in Japanese Patent No. 2723277 or Japanese Patent No. 2969953, unless adjustment is made to prevent the wire from being cut when the capillary moves in a transverse direction. In other words, the conventional techniques described in Japanese Patents No. 2723277 to No. 2530224 pose a problem that the occurrence of the fall-out of the wire and the bend in the wire can be suppressed only when the pressing force of the capillary and such are constantly adjusted to be within a certain range. In addition, the conventional techniques described in Japanese Patents No. 2723277 to No. 2530224 poses another problem that there is a case in which a bonding strength between the wire and the lead cannot be ensured as the pressing force is required to be maintained within a certain range.

An object of the present invention is to suppress a fall-out and a bend in a wire in a further effective manner.

BRIEF SUMMARY OF THE INVENTION

A wire bonding apparatus according to the present invention is provided with: a capillary configured to bond a wire inserted through the capillary to a bonding target; a first clamper configured to move in conjunction with the capillary; a second clamper disposed in line with the first clamper along an extending direction of the wire inserted through the capillary; and a controller configured to open and close the first clamper and the second clamper, wherein the controller includes: a wire cutting unit configured to cut the wire by bonding the wire using the capillary and then moving the capillary and the first clamper upward while the first clamper remains closed; and a wire extending unit configured to extend the wire from a tip end of the capillary by moving the capillary upward, and then moving the capillary and the first clamper upward in a state in which the first clamper is opened and the second clamper is closed. In addition, it is preferable that the wire cutting unit causes the capillary to perform a scrubbing operation when bonding the wire.

A wire bonding method using a wire bonding apparatus according to the present invention includes: preparing a wire bonding apparatus, the wire bonding apparatus including a capillary configured to bond a wire inserted through the capillary to a bonding target, a first clamper configured to move in conjunction with the capillary, and a second clamper disposed in line with the first clamper along an extending direction of the wire inserted through the capillary; cutting the wire by bonding the wire using the capillary and then moving the capillary and the first clamper upward while the first clamper remains closed; and extending the wire from a tip end of the capillary by moving the capillary upward, and then moving the capillary and the first clamper upward in a state in which the first clamper is opened and the second clamper is closed. In addition, it is preferable that, in the wire cutting step, the capillary is caused to perform a scrubbing operation when bonding the wire.

The present invention provides an advantageous effect of suppressing a fall-out and a bend in a wire in a further effective manner.

BRIEF DESCRIPTION OF THE SEVERAL
VIEWS OF THE DRAWINGS

Exemplary embodiments of the present invention will be described in detail based on the following figures, wherein.

Figure 3:
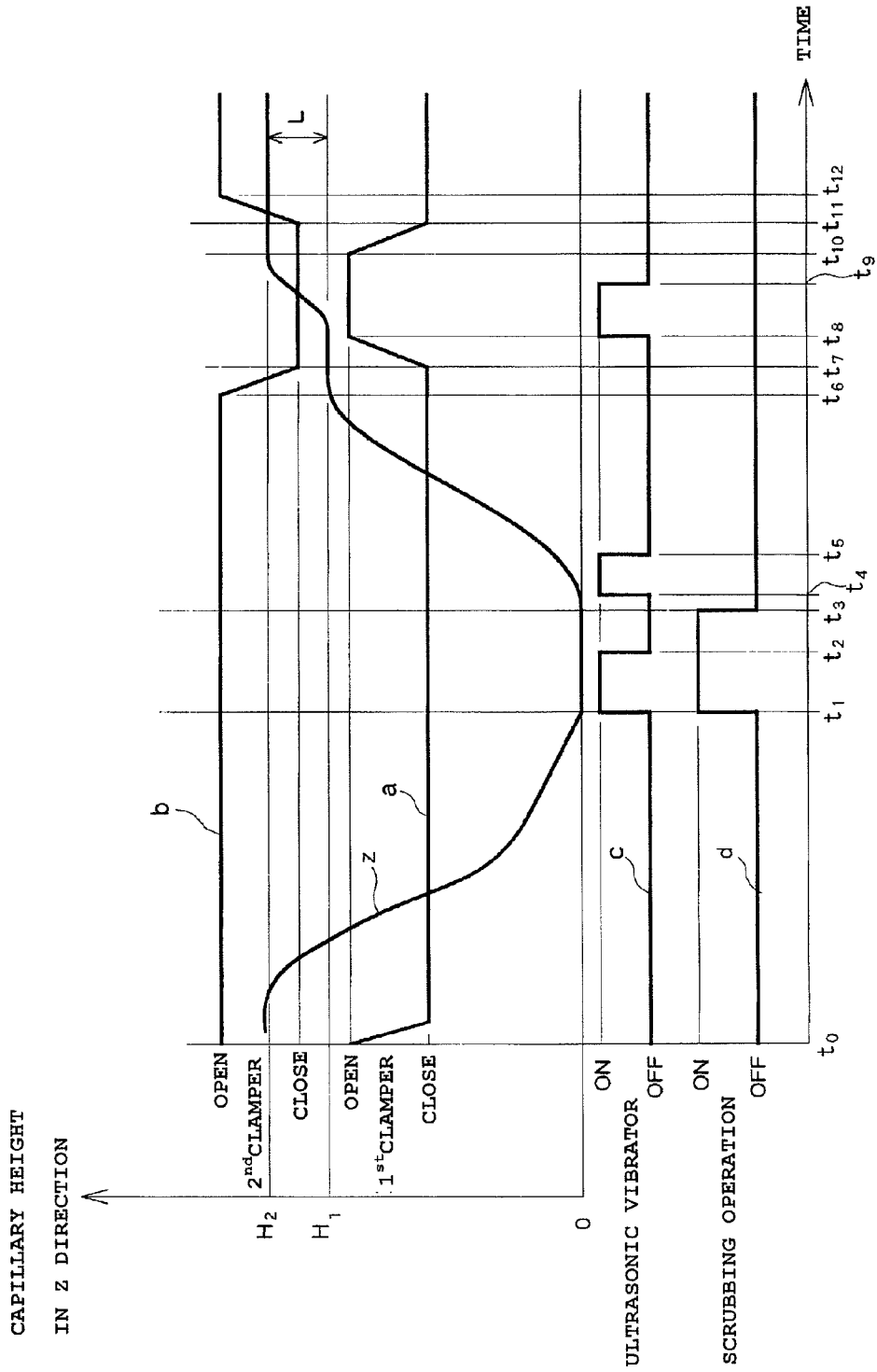
Figure 4:
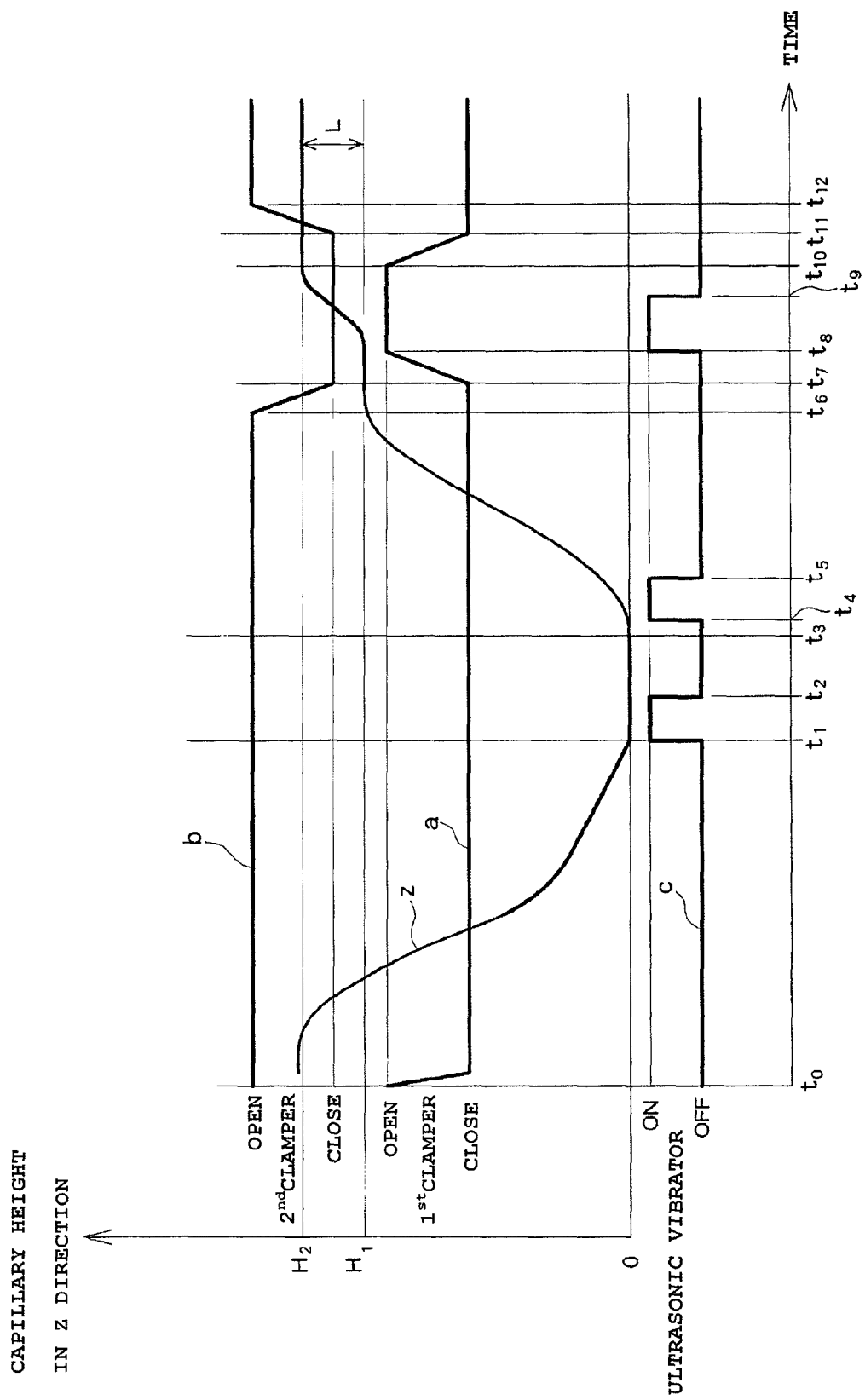

FIG. 3 is a time chart showing states of open-close operations of a first clamper and a second clamper, the height of a capillary, on and off of an ultrasonic vibrator, and a scrubbing operation of the capillary in the wire bonding apparatus according to an exemplary embodiment of the present invention; and FIG. 4 is a time chart showing states of open-close operations of the first clamper and the second clamper, the height of the capillary, and on and off of the ultrasonic vibrator in the wire bonding apparatus according to a different exemplary embodiment of the present invention.

DETAILED DESCRIPTION OF THE INVENTION

Figure 1:
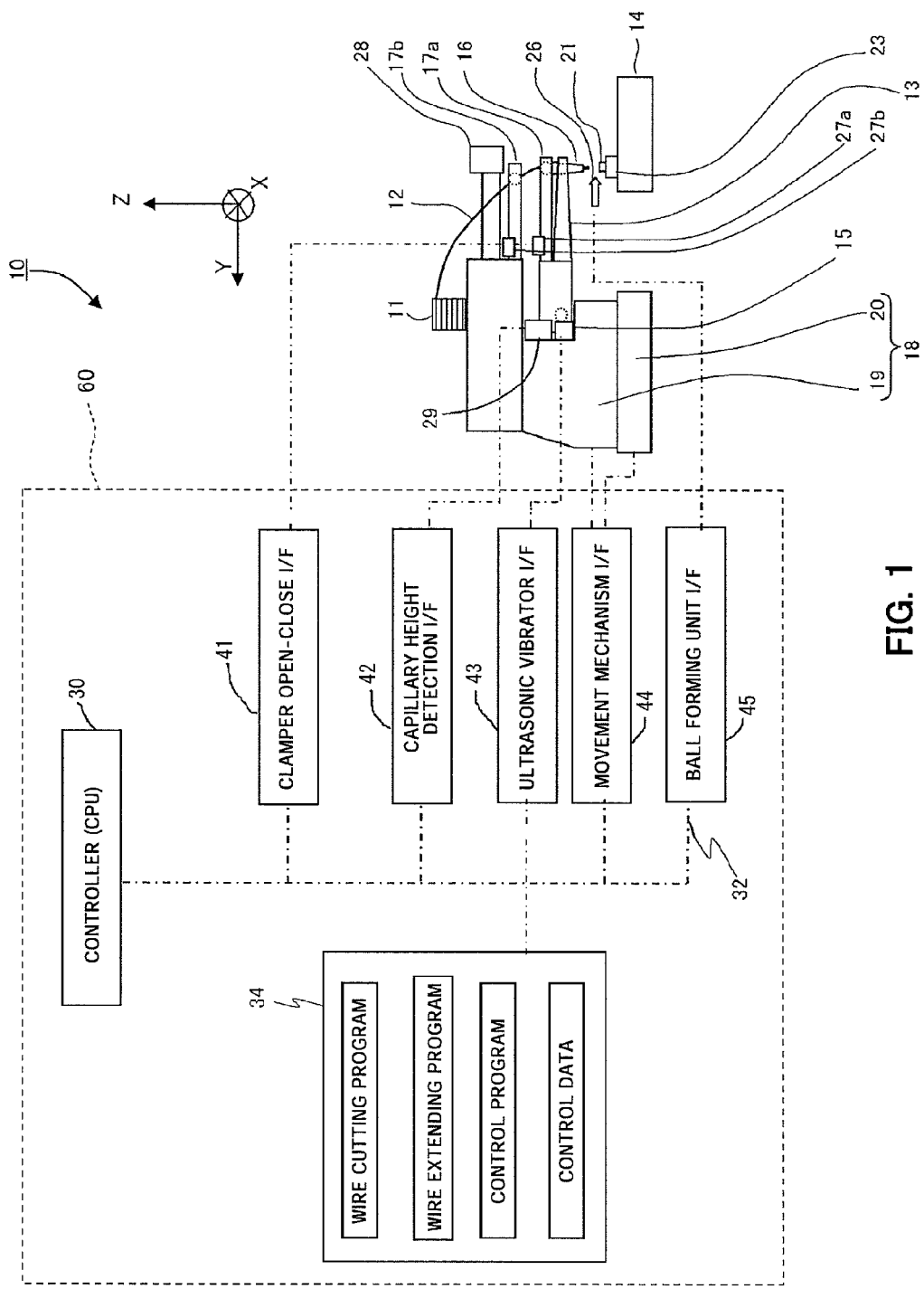
FIG. 1 is a system diagram illustrating a structure of a wire bonding apparatus according to an exemplary embodiment of the present invention.

The following describes an exemplary embodiment of the present invention with reference to the drawings. First, an entire structure of a wire bonding apparatus 10 according to the exemplary embodiment of the present invention is described with reference to FIG. 1. In FIG. 1, a signal line is shown by an alternate long and short dash line. Referring to FIG. 1, the wire bonding apparatus 10 is configured such that a bonding head 19 is disposed on an XY table 20, and the bonding head 19 is provided with a bonding arm 13. The bonding arm 13 is driven about a rotational center with a Z motor, and configured such that a tip end of the bonding arm 13 moves, in an arc, closer to and away from a pad surface of a semiconductor chip 21 as a bonding surface. The tip end of the bonding arm 13 moves in a Z direction, i.e., a vertical direction, in the vicinity of the pad surface of the semiconductor chip 21 or a surface of the lead frame 23. The tip end of the bonding arm 13 is provided with a capillary 16 as a bonding tool. The XY table 20 and the bonding head 19 configure a movement mechanism 18 capable of freely moving the bonding head 19 to any position within a plane along the bonding surface (within an XY plane) using the XY table 20, and thus driving the bonding arm 13 provided for the bonding head 19 with the Z motor allows the tip end of the bonding arm 13 and the capillary 16 provided for the tip end of the bonding arm 13 to move freely in any of X, Y, and Z directions. On a side of the tip end of the bonding arm 13 of the XY table 20, a bonding stage 14 configured to suction and fix a lead frame 23 is provided.

The capillary 16 is a circular column having a hole and a conical tip end portion, and configured such that a wire 12 made of such as a gold wire can be inserted through the hole provided in a central portion of the capillary 16. The wire 12 is supplied from a spool 11 provided above the bonding head 19. The bonding arm 13 serves to supply ultrasonic energy to the capillary 16 using an ultrasonic vibrator 15, and press the wire 12 inserted through the capillary 16 against the bonding surface, i.e., the pad surface of the semiconductor chip 21 or a lead of the lead frame 23, to bond the wire 12 to the bonding surface. Further, in the vicinity of a position of the tip end of the capillary 16, there is provided an electronic flame off 26 configured to heat the wire extending from the tip end of the capillary 16 to form an initial ball.

The bonding head 19 is provided with a first clamper 17a and a second clamper 17b each configured to hold and release the wire 12 inserted through the capillary 16. The first clamper 17a moves in the X, Y, or Z direction in conjunction with the bonding arm 13. The second clamper 17b moves in the X or Y direction in conjunction with the bonding arm 13, but its height in the Z direction is fixed. The clampers 17a and 17b are respectively provided with a first clamper open-close mechanism 27a and a second clamper open-close mechanism 27b, and each of the clampers 17a and 17b is configured to driven to open and close by an operation of the corresponding open-close mechanism 27a or 27b.

The wire bonding apparatus 10 as described above is configured to detect a position and control an operation of each component using a controller 30 having a CPU, and connect the semiconductor chip 21 with the lead frame 23 using the wire 12. The XY table 20 is provided with an XY position detecting unit configured to detect a position of the bonding head 19 in the X and Y directions. Further, the bonding head 19 is provided with a capillary height detecting unit 29 configured to detect the height of the tip end of the capillary 16 in the Z direction by detecting an angle of rotation of the bonding arm 13 about the rotational center. The capillary height detecting unit 29 can be configured to directly detect the position of the tip end of the bonding arm 13 or the tip end of the capillary 16, instead of the angle of rotation. In addition, the capillary height detecting unit 29 can be of a noncontact manner or of a contact manner.

The bonding head 19 is provided with a camera 28 as an imaging unit configured to acquire an image of the semiconductor chip 21, the lead frame 23, and such. The bonding head 19 is configured to determine the position of the capillary 16 in the X and Y directions based on the image taken with the camera 28. The camera 28 can be configured, for example, with an imaging device and a lens without a throttle mechanism or a shutter, as long as an image signal can be acquired.

Detection signals from the capillary height detecting unit 29 as described above are connected to the controller 30 through a data bus 32 via a capillary height detection interface 42, and inputted into the controller 30. Further, the movement mechanism 18 configured with the XY table 20 and the bonding head 19, the first and the second clamper open-close mechanism 27a and 27b, the ultrasonic vibrator 15, and the electronic flame off 26 are connected to the controller 30 through the data bus 32 respectively via a movement mechanism interface 44, a clamper open-close interface 41, an ultrasonic vibrator interface 43, and a ball forming unit interface 45. Each component is configured to operate based on a command from the controller 30 having the CPU.

To the data bus 32, a storage 34 is connected. The storage 34 stores control data necessary for a position detection process and a control command outputting operation performed with the controller 30, and is configured to output the control data to the controller 30 based on the command from the controller 30 and store signal data inputted to the storage 34. The controller 30, the data bus 32, the storage 34, and the interfaces 41-45 configure a computer 60 as a whole, and the storage 34 stores, in addition to the control data, a control program for controlling a bonding operation as a whole, a program for cutting the wire as a wire cutting unit, and a program for extending the wire as a wire extending unit.

Figure 2A:
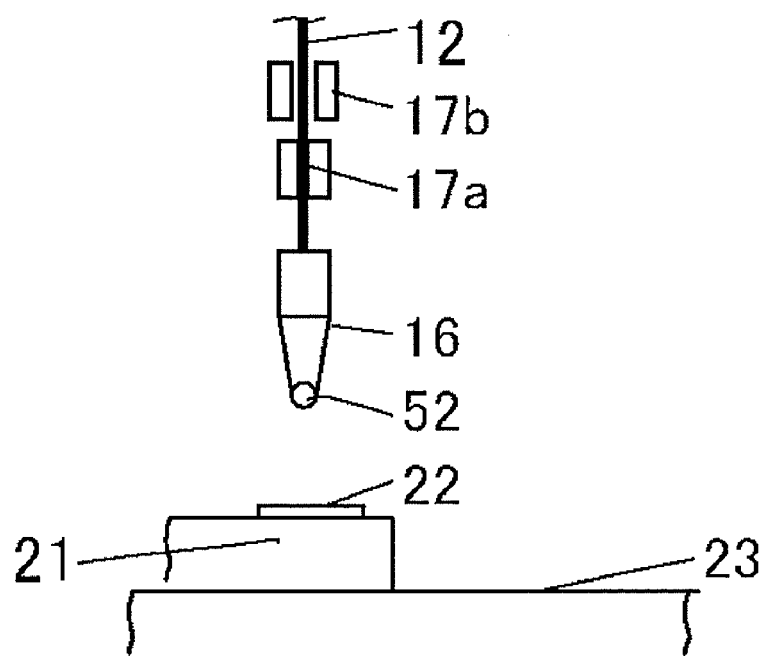
FIG. 2A is an explanatory diagram illustrating an operation of the wire bonding apparatus according to an exemplary embodiment of the present invention.

The bonding operation of the wire bonding apparatus 10 thus configured is now described with reference to FIG. 2A through FIG. 2K, and FIG. 3. First, the controller 30 reads the total control program, the program for cutting the wire, the program for extending the wire, and the control data stored in the storage 34 out to an internal memory. Further, as shown in FIG. 2A, an initial ball 52 is formed at the tip end of the capillary 16. In this state, the first clamper 17a is closed and the second clamper 17b is opened.

As shown in FIG. 2A, the controller 30 outputs a command to move the tip end of the capillary 16 to a position immediately above a pad 22 of the semiconductor chip 21. Based on this command, a command from the movement mechanism interface 44 is transmitted to the XY table 20, and the XY table 20 moves the bonding head 19 to position the capillary 16 immediately above the pad 22.

Figure 2B:
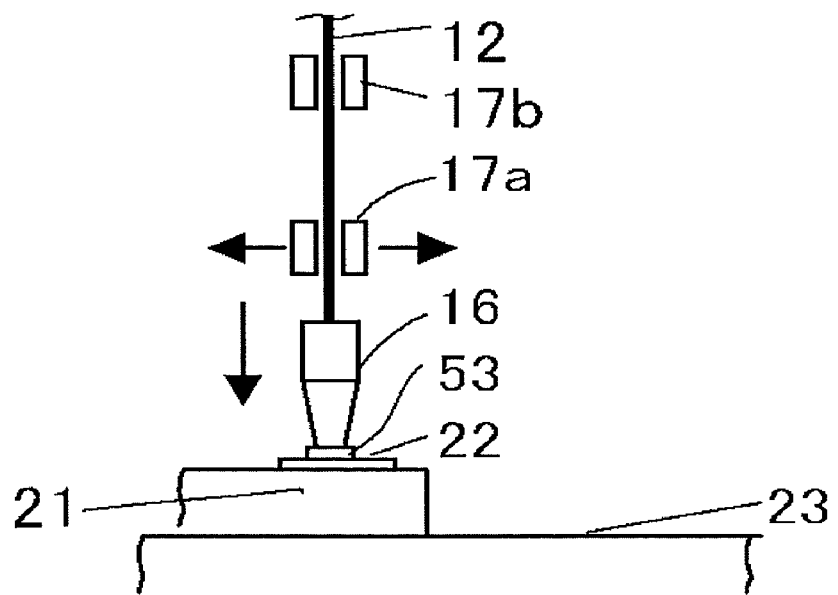
FIG. 2B is an explanatory diagram illustrating the operation of the wire bonding apparatus according to an exemplary embodiment of the present invention.

As shown in FIG. 2B, upon completion of the positioning, the controller 30 outputs a command to move the capillary 16 down to the pad 22. Based on this command, a signal for driving the Z motor of the bonding head 19 is outputted from the movement mechanism interface 44. This signal causes the Z motor to rotate, the capillary 16 to move down to the pad 22, the initial ball 52 to be pressed against the pad 22 to form a pressure-bonded ball 53, and whereby the wire 12 is bonded to the pad 22. At the same time as the capillary 16 moves down, the controller 30 outputs a command to open the first clamper 17a. Based on this command, a signal for opening the first clamper 17a is outputted from the clamper open-close interface 41. This signal causes the first clamper open-close mechanism 27a to open the first clamper 17a.

Figure 2C:
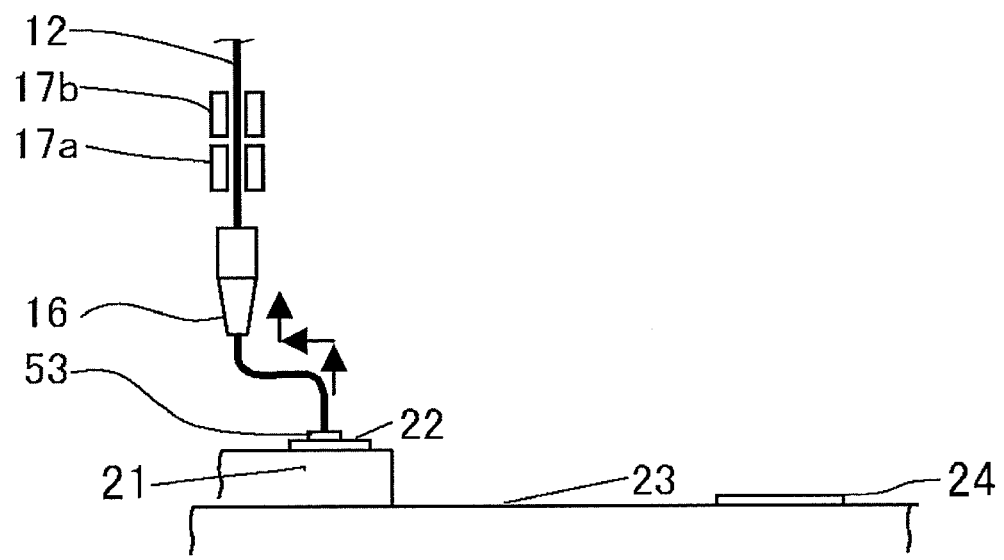
FIG. 2C is an explanatory diagram illustrating the operation of the wire bonding apparatus according to an exemplary embodiment of the present invention.

As shown in FIG. 2C, after the wire 12 is bonded to the pad 22 and the first and the second the clamper 17a and 17b are both opened, the controller 30 outputs a command to move the capillary 16 upward, horizontally in a direction opposite from a lead 24, and then further upward. Based on this command, a signal for driving the Z motor of the bonding head 19 to move the capillary 16 upward and a signal for driving the XY table 20 to position the tip end of the capillary 16 on a side opposite from the lead 24 are outputted from the movement mechanism interface 44. These signals drive the Z motor of the bonding head 19 and the XY table 20, respectively, to cause the capillary 16 to move vertically upward at the position of the pad 22, in the direction opposite from the lead 24, and then further upward.

Figure 2D:
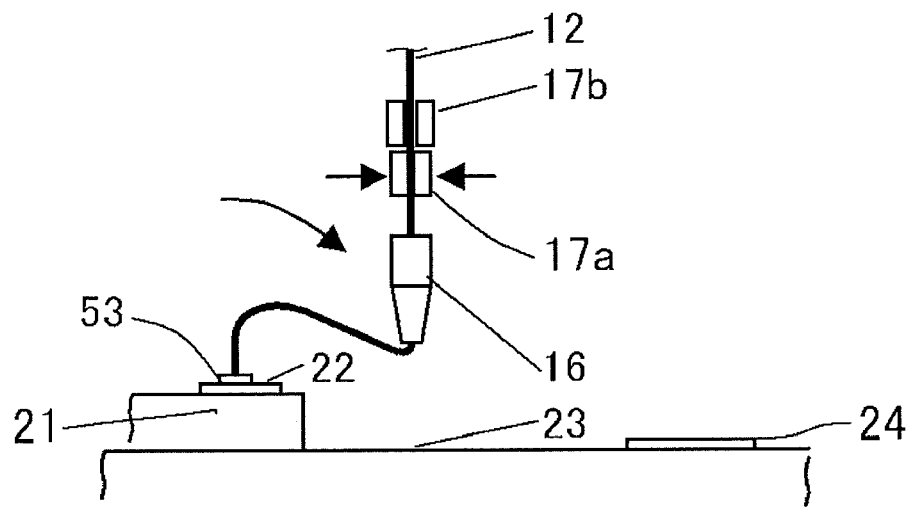
FIG. 2D is an explanatory diagram illustrating the operation of the wire bonding apparatus according to an exemplary embodiment of the present invention.

Subsequently, as shown in FIG. 2D, the controller 30 outputs a command to move the capillary 16 toward the lead 24 while moving the capillary 16 down in a looping operation and a command to close the first clamper 17a. Based on one of the commands, a signal for driving the XY table 20 to position the tip end of the capillary 16 at a position corresponding to the lead 24 and a signal for driving the Z motor of the bonding head 19 to move the capillary 16 further downward are outputted from the movement mechanism interface 44. These signals drive the Z motor of the bonding head 19 and the XY table 20, respectively, to cause the capillary 16 to move down toward the lead 24 in the looping operation. Further, based on the other command from the controller 30, a signal for closing the first clamper 17a is outputted from the clamper open-close interface 41. This signal causes the first clamper open-close mechanism 27a to close the first clamper 17a.

Figure 2E:
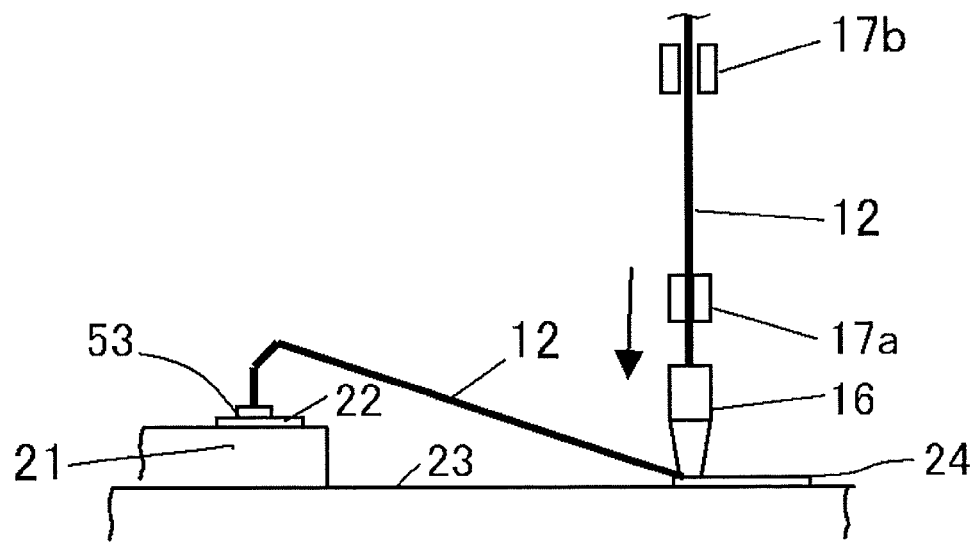
FIG. 2E is an explanatory diagram illustrating the operation of the wire bonding apparatus according to an exemplary embodiment of the present invention.

Then, as shown in FIG. 2E, the controller 30 outputs a command to move the capillary 16 further downward to perform bonding to the lead 24 when the capillary 16 comes above the lead 24. Based on this command, a signal for driving the Z motor of the bonding head 19 to move the capillary 16 down is outputted from the movement mechanism interface 44. This signal drives the Z motor of the bonding head 19, and causes the capillary 16 to move further down toward the lead 24, the wire 12 to be pressed against the lead 24 with the tip end of the capillary 16, and whereby the wire 12 is bonded to the lead 24. During a time period from the start of the looping operation until the capillary 16 performs bonding to the lead 24, the first clamper 17a remains closed and the second clamper 17b remains opened.

FIG. 3 is a graphical chart showing the open-close states of the clampers 17a and 17b, the height of the tip end of the capillary 16, an on-off state of the ultrasonic vibrator 15, and a state of a scrubbing operation of the capillary 16, in the bonding to the lead 24. In the figure, a line "a" indicates the open-close state of the first clamper 17a, a line "b" indicates the open-close state of the second clamper 17b, a line "z" indicates the height of the tip end of the capillary 16, a line "c"

indicates the on-off state of the ultrasonic vibrator 15, and a line "d" indicates the state of the scrubbing operation of the capillary 16.

Figure 2F:
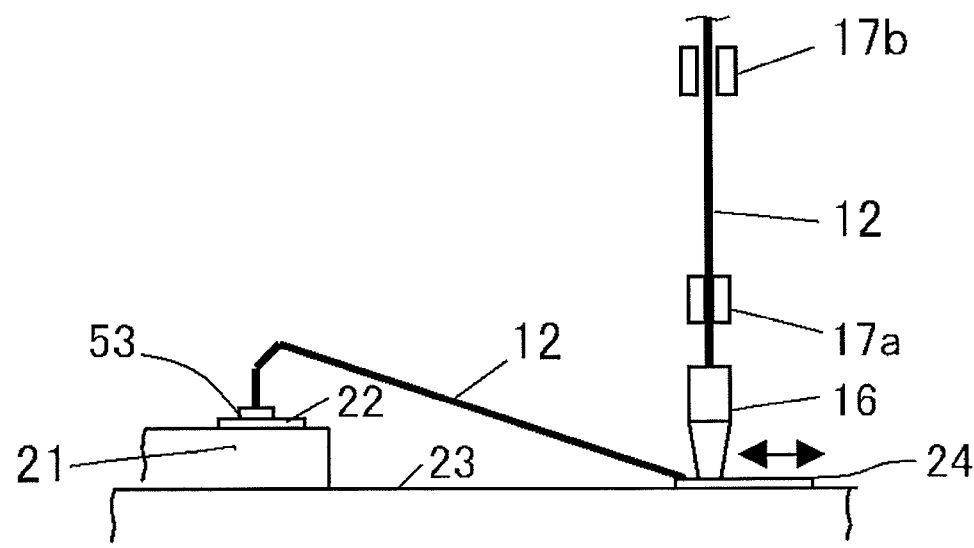
FIG. 2F is an explanatory diagram illustrating the operation of the wire bonding apparatus according to an exemplary embodiment of the present invention.

Referring to FIG. 3, when the capillary 16 starts moving down at a time $t_0$, the first clamper 17a is switched to the close state from the open state. Then, the capillary 16 is brought into contact with the lead 24 at a time $t_1$, and the capillary 16 shown in FIG. 2E performs bonding to the lead 24. During a time period from the time $t_1$ to a time $t_3$, the controller 30 causes the tip end of the capillary 16 to be pressed against the lead 24 and turns the ultrasonic vibrator 15 on to bond the wire 12 to the lead 24. Further, during the time period from the time $t_1$ to the time $t_3$ in which the wire 12 is pressed against the lead 24 with the capillary 16 as shown in FIG. 2F, the controller 30 performs the scrubbing operation in which the XY table 20 is reciprocated in directions of the pad 22 and the lead 24. The scrubbing operation of the capillary 16 produces fine cracks between a portion of the wire 12 inserted through the capillary 16 and a bonded portion to the lead 24, and facilitates the cutting of the wire 12. The reciprocating movement in the scrubbing operation is not limited to the directions of the pad 22 and the lead 24, and can be performed in any directions within a horizontal plane, or can be such that the capillary 16 is moved in a circular arc or in an elliptical arc. Alternatively, the capillary 16 can be simply moved laterally in a direction from the pad 22 toward the lead 24.

Figure 2G:
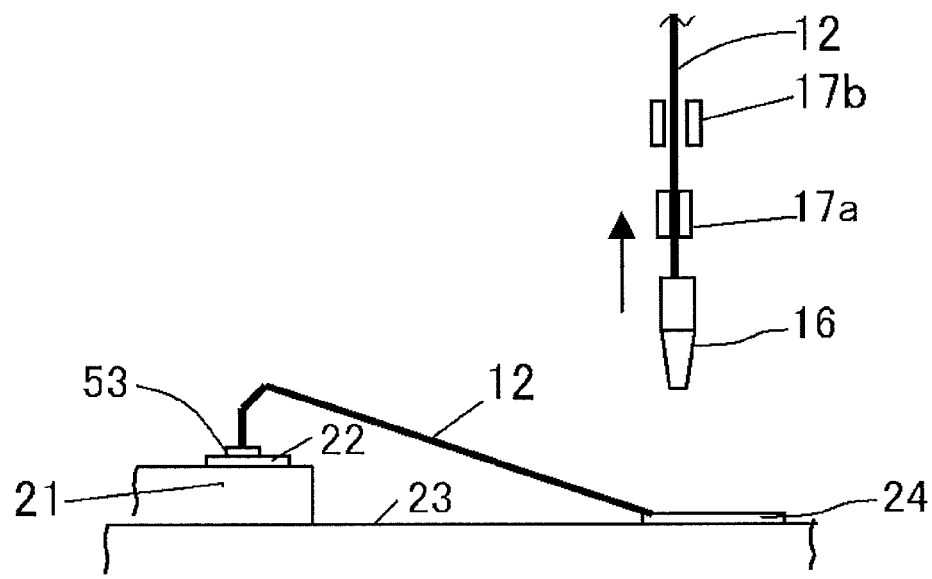
FIG. 2G is an explanatory diagram illustrating the operation of the wire bonding apparatus according to an exemplary embodiment of the present invention.

At the time $t_3$ shown in FIG. 3, the controller 30 outputs a command to move the tip end of the capillary 16 up to a height $H_1$, as shown in FIG. 2G. Based on this command, a signal for driving the Z motor of the bonding head 19 is outputted from the movement mechanism interface 44, and this signal drives the Z motor to cause the capillary 16 to move upward. At this time, the first clamper 17a remains closed, and starts moving upward along with the capillary 16 while holding the wire 12. As the wire 12 is bonded to the lead 24, the upward movement of the first clamper 17a applies an upward tensile force to the wire 12. Further, as a nearby portion of the wire 12 in the vicinity of a portion of the wire 12 bonded to the lead 24 is crushed by bonding and a cross-sectional area of this nearby portion is smaller than that of the other portions of the wire 12, and as the scrubbing operation of the capillary 16 produces the fine cracks between the wire 12 and the bonded portion to the lead 24, the wire 12 is cut at the nearby portion in the vicinity of the portion bonded to the lead 24 by the tensile force (wire cutting step). At this time, in order to further facilitate the cutting of the wire 12, the controller 30 turns the ultrasonic vibrator 15 on to cause the tip end of the capillary 16 to vibrate during a time period from a time $t_4$ to a time $t_5$ shown in FIG. 3.

According to this exemplary embodiment, while the capillary 16 moves upward after the bonding to the lead 24 in the wire cutting step, the first clamper 17a remains closed as shown in FIG. 3. Therefore, even if the wire 12 is cut during the bonding to the lead 24, the wire 12 can not fall out from the capillary 16. However, a tail wire 51 does not extend from the tip end of the capillary 16 as the wire is cut before the tail wire 51 extends from the tip end of the capillary 16.

As shown in FIG. 3, the controller 30 obtains a signal indicating a height of the tip end of the capillary 16 acquired with the capillary height detecting unit 29 via the capillary height detection interface 42 shown in FIG. 1, and compares this height with the height $H_1$. Then, when the height of the tip end of the capillary 16 corresponds to the height $H_1$, a signal for sopping the Z motor is outputted from the movement mechanism interface 44, and whereby the upward movement of the capillary 16 is stopped.

Figure 2H:
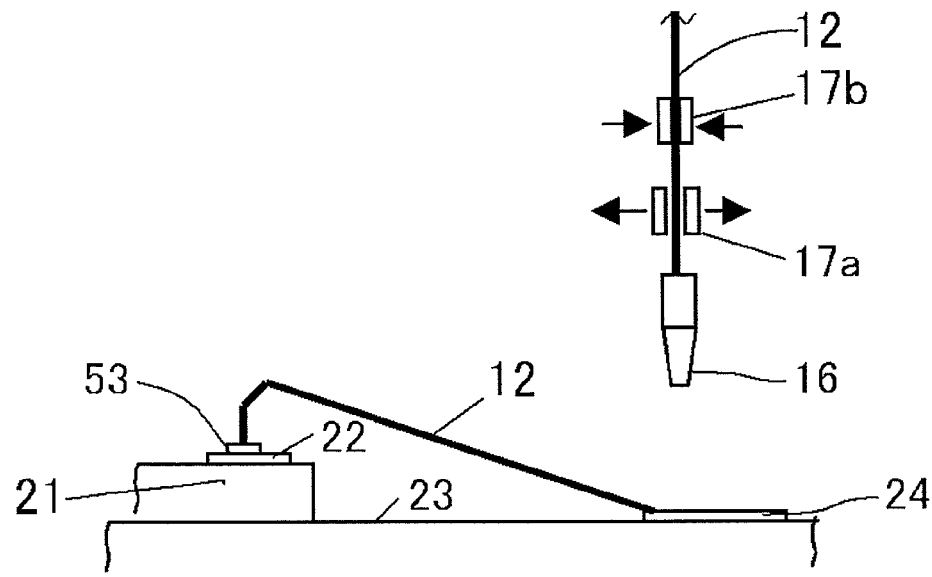
FIG. 2H is an explanatory diagram illustrating the operation of the wire bonding apparatus according to an exemplary embodiment of the present invention.

As shown in FIG. 2H, when the height of the tip end of the capillary 16 corresponds to the height $H_1$ at a time $t_6$ shown in FIG. 3, the controller 30 outputs a command to close the second clamper 17b. Based on this command, a signal for closing operation is outputted to the second clamper open-close mechanism 27b from the clamper open-close interface 41. This signal causes the second clamper open-close mechanism 27b to perform the closing operation, and whereby the second clamper 17b is closed and holds the wire 12. Then, upon completion of the closing operation of the second clamper 17b at a time $t_7$ shown in FIG. 3, the controller 30 outputs a command to open the first clamper 17a. Based on this command, a signal for opening operation is outputted to the first clamper open-close mechanism 27a from the clamper open-close interface 41. This signal for opening operation causes the first clamper open-close mechanism 27a to perform the opening operation, and whereby the first clamper 17a is opened and releases the wire 12 that has been held with the first clamper 17a.

Figure 2I:
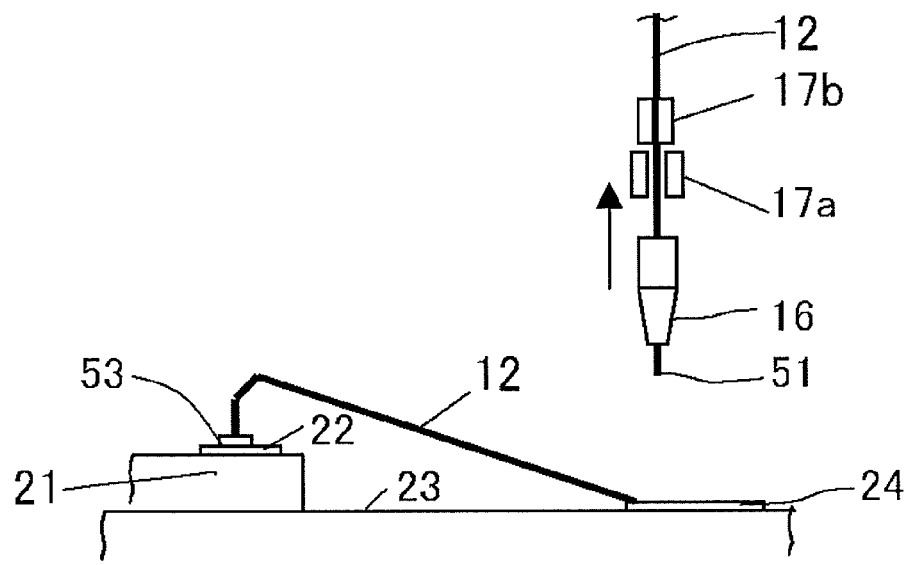
FIG. 2I is an explanatory diagram illustrating the operation of the wire bonding apparatus according to an exemplary embodiment of the present invention.

When the clamper holding the wire 12 is switched from the first clamper 17a to the second clamper 17b at a time $t_8$ shown in FIG. 3, the controller 30 outputs a command to move the tip end of the capillary 16 up to a height $H_2$ from the height $H_1$. Based on this command, the Z motor of the bonding head 19 is driven and the capillary 16 starts moving upward. At this time, as the second clamper 17b is closed and holds the wire 12 in a direction of the height, the height of the wire 12 does not change, and only the capillary 16 and the first clamper 17a move upward from the height $H_1$ to the height $H_2$. As shown in FIG. 2I, this causes the tail wire 51 to extend from the tip end of the capillary 16. Further, as shown by a time period from the time $t_8$ to a time $t_9$ shown in FIG. 3, the controller 30 moves the capillary 16 upward and turns the ultrasonic vibrator 15 on to cause the tip end of the capillary 16 to vibrate, so that the wire 12 is smoothly inserted through the hole in the capillary 16.

The controller 30 detects the height of the tip end of the capillary 16 using the capillary height detecting unit 29, and, when the height reaches the height $H_2$, outputs a command to stop the upward movement of the capillary 16 to the movement mechanism interface 44. Based on this command, a signal for stopping the Z motor is outputted from the movement mechanism interface 44. This signal stops the Z motor, and the upward movement of the capillary 16 stops. When the capillary 16 stops, the tail wire 51 extends from the tip end of the capillary 16 by an amount of a difference L between the height $H_1$ and the height $H_2$ shown in FIG. 3 (wire extending unit).

Figure 2J:
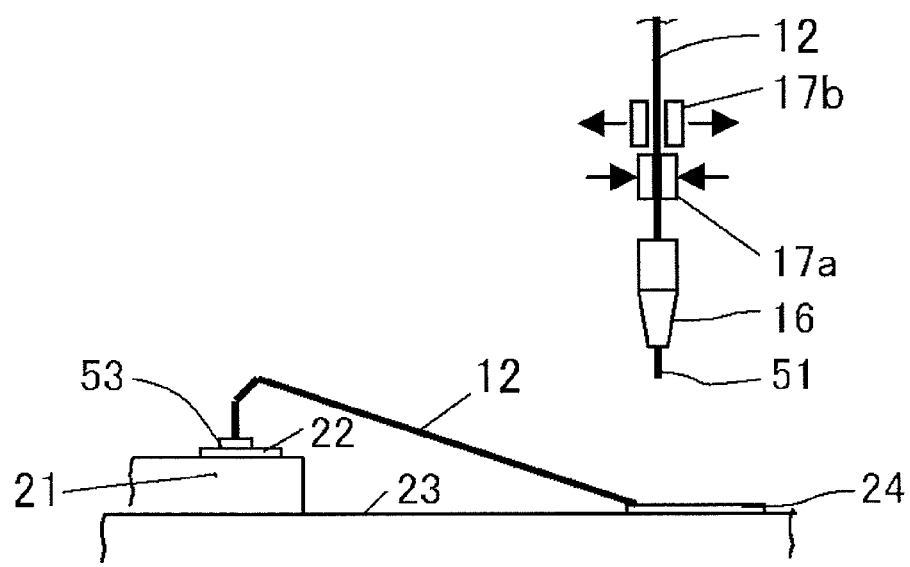
FIG. 2J is an explanatory diagram illustrating the operation of the wire bonding apparatus according to an exemplary embodiment of the present invention.

Upon completion of the extension of the tail wire 51, the controller 30 outputs a command to close the first clamper 17a at a time $t_{10}$ shown in FIG. 3. As shown in FIG. 2J, based on this command, a signal for closing the first clamper 17a is outputted from the clamper open-close interface 41, and this signal causes the first clamper open-close mechanism 27a to close the first clamper 17a. Then, when the first clamper 17a is closed at a time $t_{11}$ shown in FIG. 3, the controller 30 outputs a command to open the second clamper 17b. Based on this command, a signal for opening the second clamper 17b is outputted from the clamper open-close interface 41, and this signal causes the second clamper open-close mechanism 27b to open the second clamper 17b. Then, when the second clamper 17b is opened at a time $t_{12}$ shown in FIG. 3 and the clamper holding the wire 12 is switched from the second clamper 17b to the first clamper 17a, the controller 30 causes the movement mechanism 18 to move the capillary 16 to a position at which an initial ball is formed as shown in FIG. 2K, and forms the initial ball 52 for subsequent wire bonding.

Figure 2K:
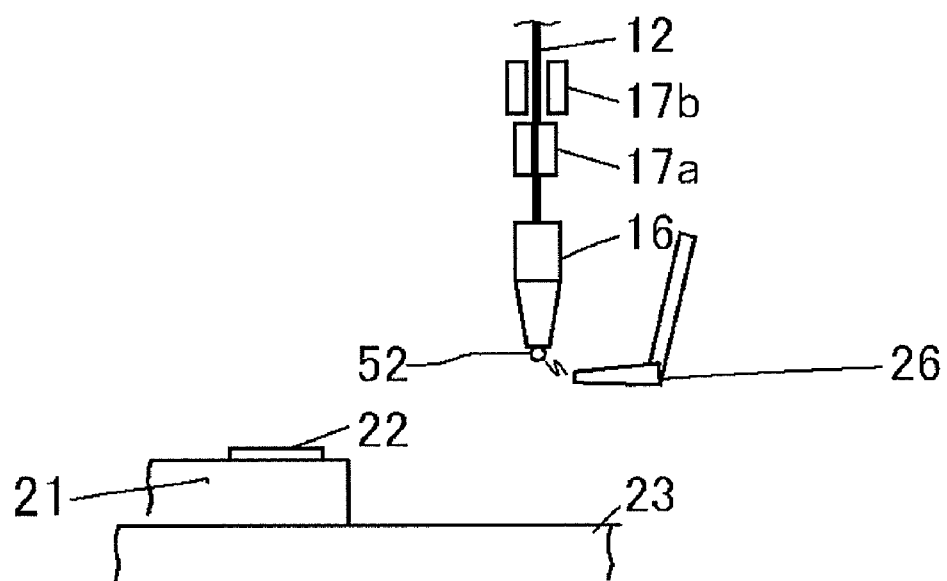
FIG. 2K is an explanatory diagram illustrating the operation of the wire bonding apparatus according to an exemplary embodiment of the present invention.

As shown in FIG. 2K, the controller 30 outputs a command to move the tip end of the capillary 16 to the position at which an initial ball is formed to the movement mechanism interface 44. Based on this command, the XY table 20 is driven, and the tip end of the capillary 16 is moved to the position at which an initial ball is formed. When the capillary 16 reaches a predetermined position, the controller 30 outputs a command to form an initial ball to the ball forming unit interface 45. Based on this command, the electronic flame off 26 is driven, and the tail wire 51 extending from the tip end of the capillary 16 is heated and rolls up into the initial ball 52. Upon completion of the formation of the initial ball 52, the controller 30 moves the capillary 16 above the next pad 22 to perform subsequent bonding.

According to the exemplary embodiment described above, as the bonding to the lead 24 is performed in the state in which the first clamper 17a is closed, the wire 12 can not fall out from the capillary 16 even if the wire 12 is cut during the bonding, and it is possible to effectively suppress the fall-out of the wire. Further, the adjustment of the pressing force of the capillary 16 is sufficient at a degree at which the wire can be cut by the bonding. As the nearby portion of the wire 12 bonded to the lead 24 can be crushed to a large extent and the cross-sectional area of this nearby portion is decreased even if the wire 12 cannot be cut in the bonding, it is possible to provide advantageous effects of reducing a repulsive force of the wire 12 when cutting the wire 12 and more effectively suppressing the bend in the wire 12 as compared to the conventional techniques. Moreover, according to this exemplary embodiment, the capillary 16 is caused to perform the scrubbing operation when the wire 12 is pressed against the lead 24 using the capillary 16 to produce the fine cracks between the wire 12 and the bonded portion such that the wire 12 can be easily cut. Even if the wire 12 is cut during this scrubbing operation, the fall-out of the wire can be effectively suppressed as the wire 12 is held with the first clamper 17a, without requiring fine adjustment of the scrubbing operation. Furthermore, as it is possible to sufficiently perform the scrubbing operation, the bonding strength between the wire 12 and the lead 24 can be increased.

According to this exemplary embodiment, the capillary 16 is caused to perform the scrubbing operation while the capillary 16 presses the wire against the lead 24. However, as shown in FIG. 4, it is possible to perform the bonding without the scrubbing operation with the capillary 16.

According to the exemplary embodiment described above, the wire 12 is cut after the bonding to the lead 24. However, the present invention can also be applied to a boding process in which the initial ball 52 is bonded to the lead 24 and then the wire 12 is cut after the bonding to the pad 22.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

The invention claimed is:

1. A wire bonding method of a wire bonding apparatus comprising:
   a capillary configured to bond a wire inserted through the capillary to a bonding target;
   a first clamper configured to move in conjunction with the capillary; and
   a second clamper disposed in line with the first clamper along an extending direction of the wire inserted through the capillary,
   the method comprising:
   a wire cutting step of cutting the wire by bonding the wire using the capillary in a state in which the first clamper is closed and the second clamper is opened, and then moving the capillary and the first clamper upward while the first clamper remains closed and the second clamper remains opened; and
   a wire extending step of extending the wire from a tip end of the capillary by moving the capillary upward, and then moving the capillary and the first clamper upward in a state in which the first clamper is opened and the second clamper is closed.

2. The wire bonding method according to claim 1, wherein in the wire cutting step, when bonding the wire, the tip end of the capillary is pressed against the bonding target and the tip end of the capillary is caused to vibrate by turning an ultrasonic vibrator on while the capillary is caused to perform a scrubbing operation.

3. The wire bonding method according to claim 1, wherein in the wire cutting step, when bonding the wire, the tip end of the capillary is pressed against the bonding target and the tip end of the capillary is caused to vibrate by turning an ultrasonic vibrator on.

4. The wire bonding method according to claim 1, wherein in the wire cutting step, the capillary and the first clamper are moved upward while the tip end of the capillary is caused to vibrate by turning an ultrasonic vibrator on so that the wire is completely cut.

5. The wire bonding method according to claim 1, wherein in the wire extending step, the capillary and the first clamper are moved upward while the tip end of the capillary is caused to vibrate by turning an ultrasonic vibrator on so that the wire is smoothly inserted into a hole in the capillary.

* * * * *